United States Patent [19]

Peacock et al.

[11] Patent Number: 5,534,662
[45] Date of Patent: Jul. 9, 1996

[54] CHASSIS MOUNTED ELECTROMAGNETIC INTERFERENCE GROUNDING ASSEMBLY FOR ELECTRONIC MODULES

[75] Inventors: James L. Peacock; Bruce P. Otis, both of Rochester, Minn.

[73] Assignee: International Business Machines Corporation, Armonk, N.Y.

[21] Appl. No.: 298,625

[22] Filed: Aug. 31, 1994

[51] Int. Cl.$^6$ .................................................. H05K 9/00
[52] U.S. Cl. ........................... 174/35 GC; 267/160
[58] Field of Search .................... 174/35 R, 35 GC, 174/35 C, 35 MS; 220/DIG. 1, 677, 680, 681, 690, 693; 455/300, 301; 439/271, 272, 273, 276, 278, 608, 92, 95, 108; 361/816, 818, 822; 29/747; 267/158, 160

[56] References Cited

U.S. PATENT DOCUMENTS

| | | | |
|---|---|---|---|
| 2,825,042 | 2/1958 | Tollefson et al. | 339/253 |
| 3,504,095 | 3/1970 | Roberson et al. | 174/35 R |
| 3,904,810 | 9/1975 | Kraus | 174/35 MS |
| 4,525,595 | 6/1985 | Harriman | 174/35 GC |
| 4,780,570 | 10/1988 | Chuck | 174/35 GC |
| 4,889,959 | 12/1989 | Taylor et al. | 174/35 GC |
| 5,001,297 | 3/1991 | Peregrim et al. | 174/35 GC |
| 5,029,254 | 7/1991 | Stickney | 174/35 GC |
| 5,043,528 | 8/1991 | Mohr | 174/35 GC |
| 5,070,216 | 12/1991 | Thornton | 174/35 GC |
| 5,191,544 | 3/1993 | Benck et al. | 364/708 |
| 5,204,496 | 4/1993 | Boulay et al. | 174/35 GC |

*Primary Examiner*—Kristine L. Kincaid
*Assistant Examiner*—Christopher Horgan
*Attorney, Agent, or Firm*—Andrew J. Dillon

[57] ABSTRACT

A spring carrier assembly to attenuate EMI, including an elongated multileaf conductive spring and an elongated carrier. The elongated multileaf conductive spring has a free edge and curved edge. The elongated carrier has a first edge section encompassing the curved edge and a second edge section encompassing the free edge, wherein portions of the conductive spring are exposed and may contact electronic modules in use. The carrier includes a first pivot member formed at a first end of the first edge section of the carrier and second pivot member formed a second end of the first edge section. Spring carriers assemblies may be placed within a housing for receiving electronic modules. Placement of a number of spring carrier assemblies within the housing forms one or more arrays of spring carrier assemblies. An electronic module may be placed within the housing between two arrays of the spring carrier assembly. The spring carrier assemblies pivot or rotate away from the electronic module to allow placement of the module within the housing. Upon insertion of the adjacent electronic module, the spring carrier assembly rotates back into a position parallel to the first electronic module, wherein the conductive springs contact the electronic modules providing EMI grounding.

8 Claims, 5 Drawing Sheets

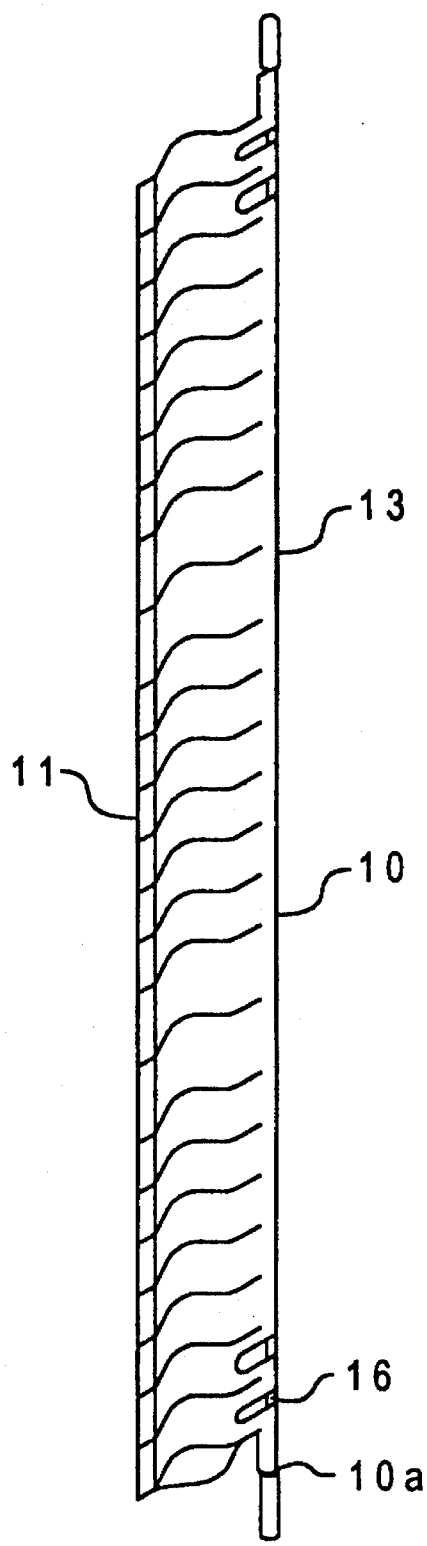
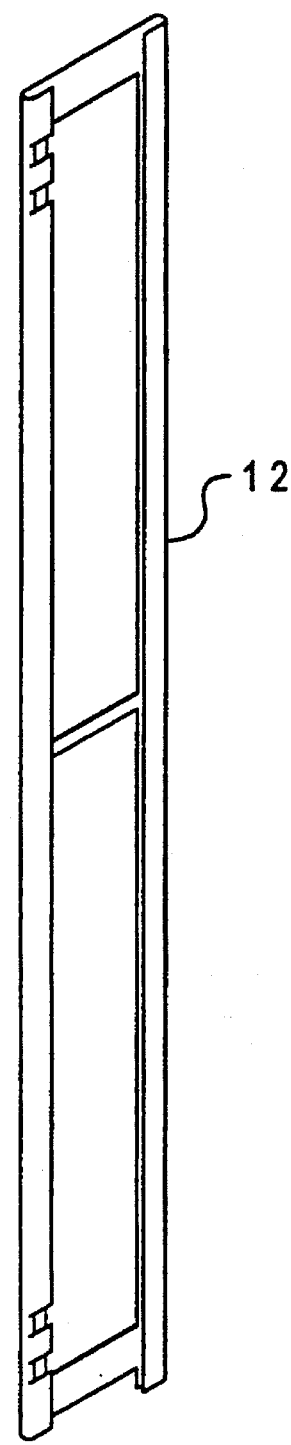
Fig. 1
Fig. 2

CHASSIS MOUNTED ELECTROMAGNETIC INTERFERENCE GROUNDING ASSEMBLY FOR ELECTRONIC MODULES

BACKGROUND OF THE INVENTION

1. Technical Field

The present invention relates to electromagnetic interference shielding, and in particular to electromagnetic interference shielding for electronic devices. More specifically, the present invention relates to an electromagnetic interference shielding assembly for use between electronic devices.

2. Description of the Related Art

It is critical today to shield electronic equipment, such as computers, against electromagnetic interference (EMI) emissions. In the past, computer products contained slower processors. Consequently, the problem of escaping emissions of these types through openings in computer enclosures was not significant. But the advance of faster processors and switching has changed this situation. While increased processing speeds have made remarkable improvements in performance and proficiency, EMI containment problems have been exacerbated.

Today, it is not uncommon for computers to employ clock speeds in the range of 50 to 200 MHz or more. Furthermore, digital circuits operating at these high frequencies may have pulse rise times of a nanosecond or less. These high speeds can cause EMI to be radiated at harmonic frequencies in excess of one GHz.

The Federal Communications Commission ("FCC") has established standards that limit the amount of allowable EMI emissions from electronic devices. To meet FCC emissions standards it is necessary to seal around expansion slots holding electronic modules cards and to seal around slots covered by blanks when these slots are not being used. In addition, commercial pressure exists to compact the spacing between expansion slots or openings.

To attenuate EMI, electronic modules need to be more properly grounded around their perimeter. The electronic modules are typically packaged next to one another with grounding springs between the modules being required. Installing springs on the electronic modules requires special module handling requirements as the delicate grounding springs are easily damaged. One method employed to avoid this damage is to mount grounding springs directly to the chassis, which supports the module. See U.S. Pat. No. 4,780,570. Chassis mounted springs also eliminate the need to modify or retrofit previously assembled modules. The main problem with the chassis mounted spring is that very little space is available for mounting them. Electronic modules are typically placed very close to one another, and consequently very little room is available for an EMI grounding spring that can maintain it's shape and function. Therefore, it would be advantageous to have an improved EMI grounding spring that fits between modules and maintains its shape and function.

SUMMARY OF THE INVENTION

It is one object of the present invention to provide electromagnetic interferences shielding.

It is another object of the present invention to provide electromagnetic interference shielding for electronic modules.

It is yet another object of the present invention to provide an electromagnetic shielding assembly for use between electronic modules.

The present invention provides a spring carrier assembly that is employed to attenuate EMI. The spring carrier assembly includes an elongated multileaf conductive spring and an elongated carrier. The elongated multileaf conductive spring has a free edge and a curved edge. The elongated carrier has a first edge section encompassing the curved edge and a second edge section encompassing the free edge, wherein remaining portions of the conductive spring are exposed and may contact electronic modules in use. The carrier includes a first pivot member formed at a first end of the first edge section of the carrier and second pivot member formed at a second end of the first edge section.

Spring carrier assemblies may be placed within a chassis for receiving electronic modules. The chassis has a top wall and a bottom wall, the top wall being parallel to the bottom wall; the top wall having voids arranged in at least one array; the bottom wall having voids arranged in at least one array, wherein each void in the top wall is opposite a corresponding void in the bottom wall. Placement of the first pivot within a void in the top and placement of the second pivot within a corresponding void secures the spring carrier assembly to the chassis, wherein the spring carrier assembly may pivot to allow placement of an electronic module next to the spring carrier assembly. Placement of a number of spring carrier assemblies within the chassis creates arrays of spring carrier assemblies. An electronic module may be placed within the chassis between two spring carrier assemblies. The spring carrier assemblies pivot or rotate away from the electronic module, as the module is inserted into the chassis between the two spring carrier assemblies. Upon insertion of the adjacent electronic module, the spring carrier assembly rotates back into a position parallel to the first electronic module, wherein the conductive springs contact the electronic modules providing EMI grounding.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 is an oblique view of a one-piece multi-leaf spring in accordance with a preferred embodiment of the present invention;

FIG. 2 is an oblique view of a carrier in accordance with a preferred embodiment of the present invention;

DETAILED DESCRIPTION OF PREFERRED EMBODIMENT

Figure 3:
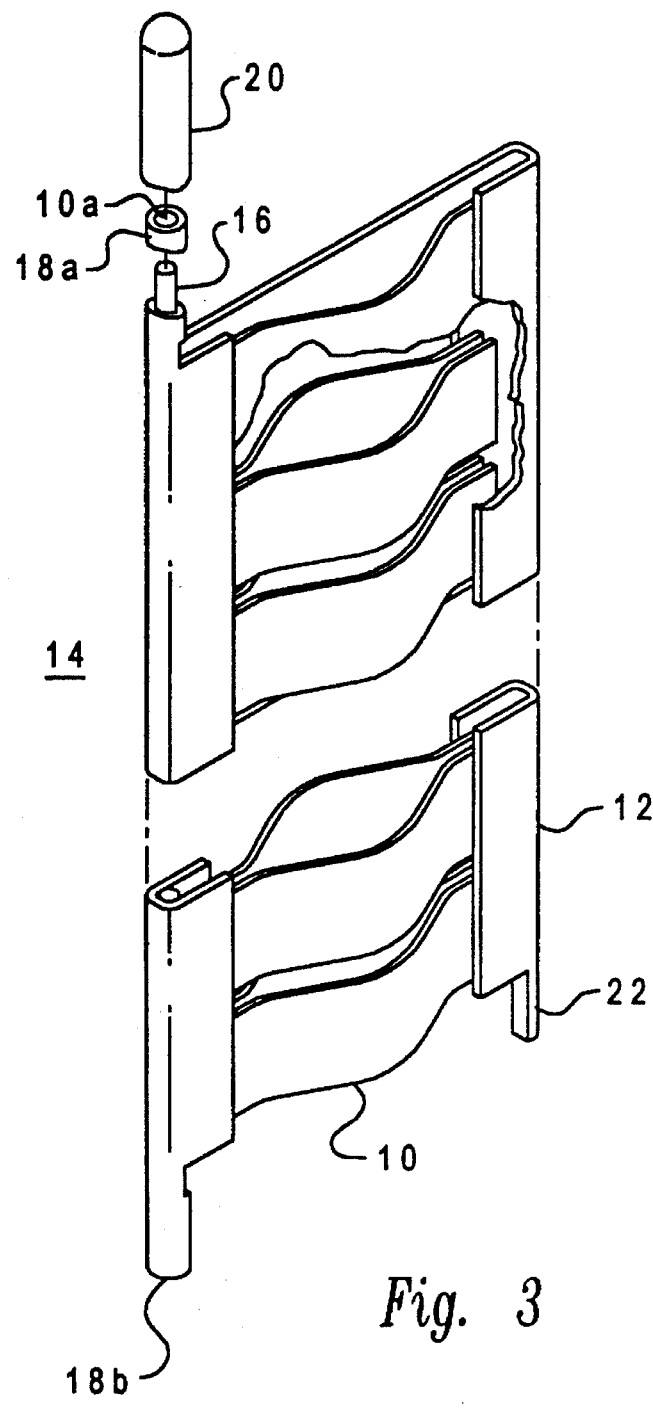
FIG. 3 is a detailed oblique view of a spring carrier assembly in aaccordance with a preferred embodiment of the present invention.

With reference now to the figures and in particular with reference to FIG. 1, a one-piece multi-leaf spring 10 is depicted in accordance with a preferred embodiment of the present invention. Spring 10 includes a free edge 11 and a curved edge 13. Spring 10 is formed to accommodate pin 16 along the inside of curved edge 10a. Spring 10 is comprised of a nickel silver alloy in accordance with a preferred embodiment of the present invention. Of course other materials or alloys employed in EMI shielding may be used to form spring 10.

Figure 5:
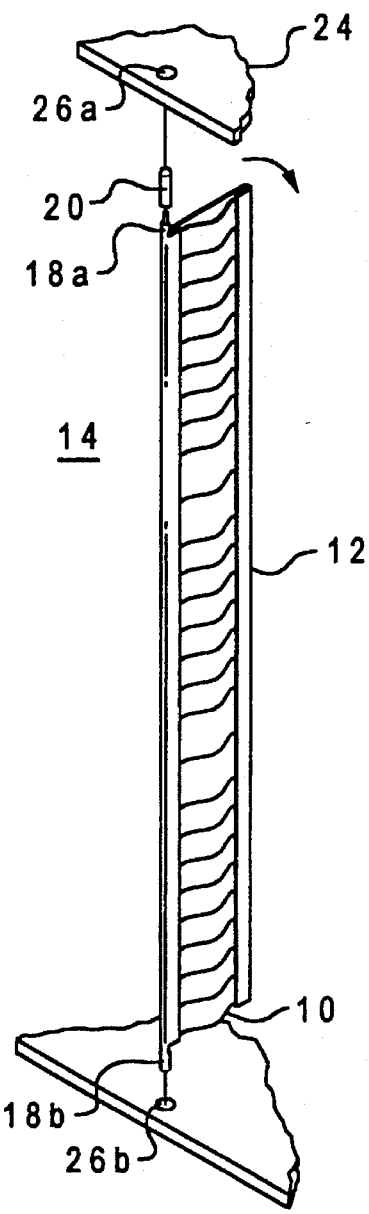
FIG. 5 is a detailed oblique depiction of a spring carrier assembly in accordance with a preferred embodiment of the present invention.

Referring next to FIG. 2, an oblique view of a carrier 12 is depicted in accordance with a preferred embodiment of the present invention. Carrier material may be any electrical conductive material with required mechanical properties to support the springs. An oblique view of spring carrier assembly 14 is depicted in FIG. 3. Spring 10 is contained within carrier 12 such that carrier 12 protects the free ends of spring 10 from damage. In addition, carrier 12 also maintains the shape of spring 10 and provides structural support. Pin 16 is employed to secure spring 10 to carrier 12. Pin 16 is placed through curved edge 10a in spring 10 and is secured to the carrier 12 by pivots 18a and 18b formed into the sheet metal ends at the top and bottom portion of carrier 12. A retainer spring 20 is secured to the top pivot 18a. Retainer spring 20 is employed to retain the spring carrier assembly 14 in the chassis as shown in FIG. 5 as well as improve electrical grounding for attenuating EMI in accordance with the preferred embodiment of the present invention. Tab 22 is formed in carrier 12 and is employed to prevent excess rotation of spring carrier assembly 14 after installation in a chassis, also called a "housing".

Figure 4:
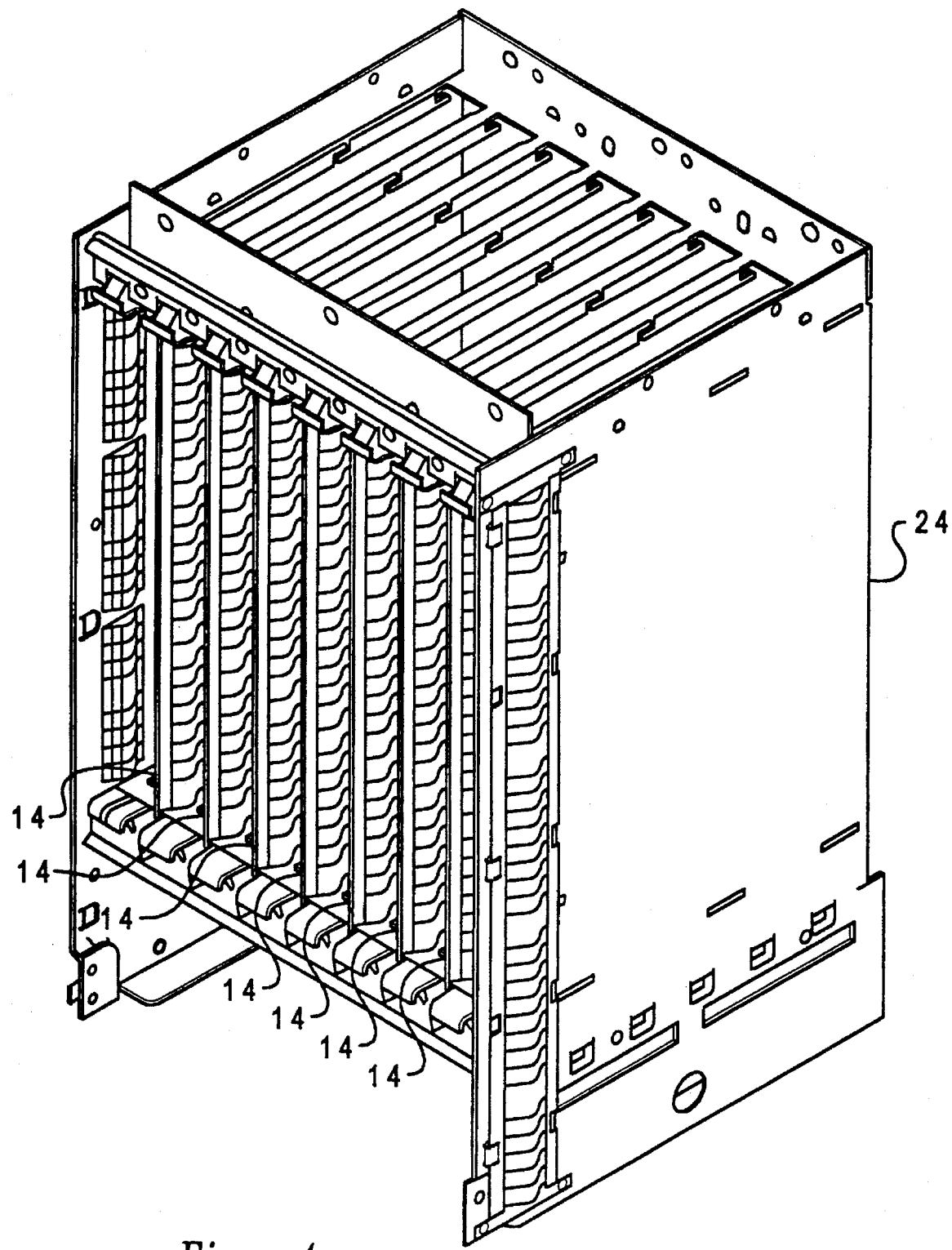
FIG. 4 is an oblique depiction of a chassis in accordance with the preferred embodiment of the present invention.

Referring next to FIG. 4 an oblique depiction of a portion of chassis 24 is illustrated in accordance with a preferred embodiment of the present invention. Chassis 24 includes a number of spring carrier assemblies 14 mounted within it.

In FIG. 5, an oblique depiction of spring carrier assembly 14 is illustrated in accordance with a preferred embodiment of the present invention. As can be seen, spring carrier assembly 14 may be inserted into chassis 24 by inserting pivots 18a and 18b into holes 26a and 26b. Pivot 18a is placed into hole 26a of chassis 24 and includes retainer spring 20. Spring carrier assembly 14 is pushed upward, compressing retainer spring 20, until pivot 18b is aligned with hole 26b in chassis 24. Spring carrier assembly 14 then drops into hole 26b. Retainer spring 20 maintains a downward force on spring carrier assembly 14 and prevents bottom pivot 18b from inadvertently coming out of hole 26b. In accordance with a preferred embodiment of the present invention, installation and removal of spring carrier assembly may be performed without tools.

Figure 6:
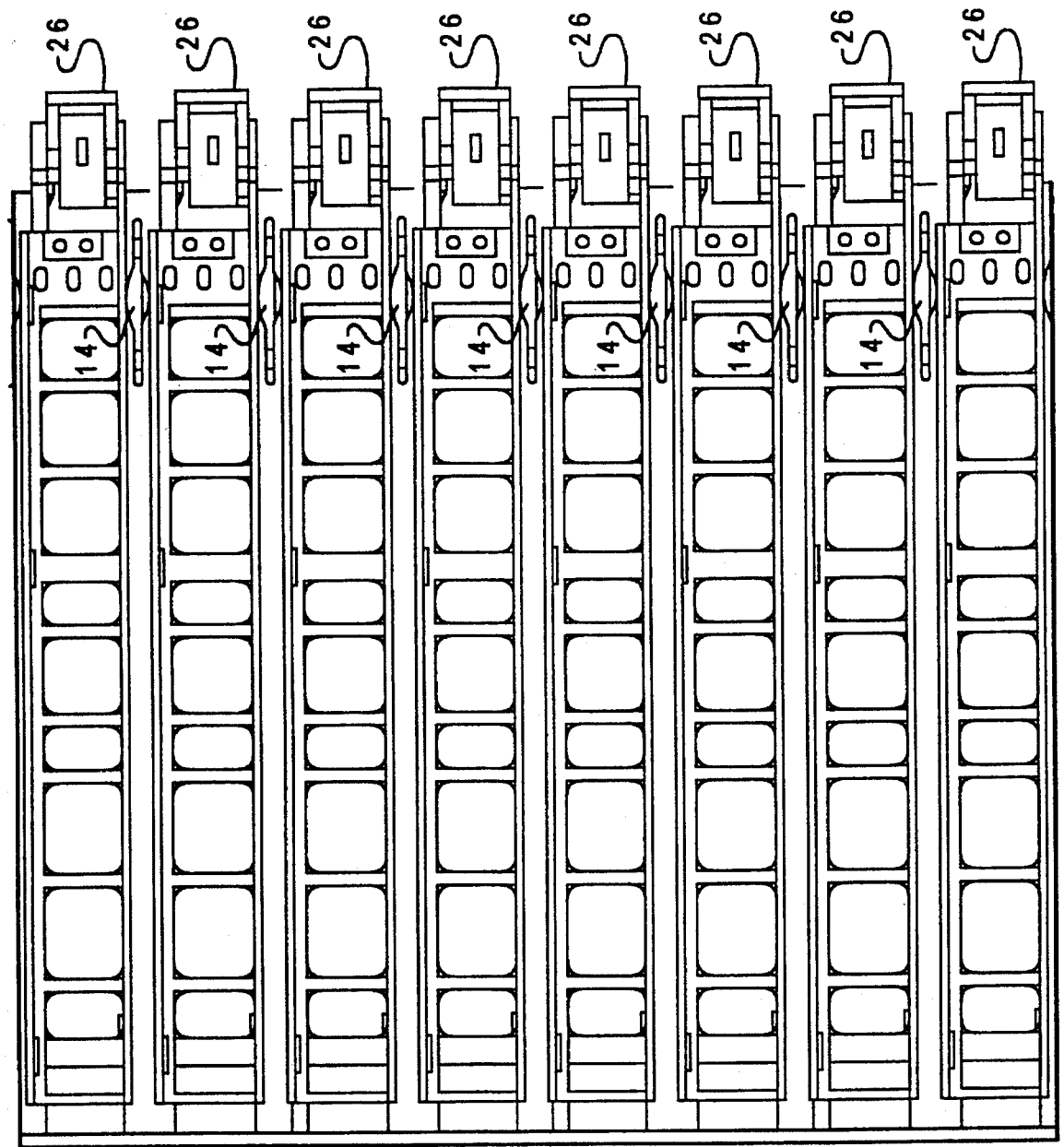
FIG. 6 is a plan view of the chassis in accordance with a preferred embodiment of the present invention.

A plan view of chassis 24 is illustrated in FIG. 6. A number of electronic modules 26 have been placed within chassis 24. With reference to FIG. 6, spring carrier assemblies 14 are in a position parallel with modules 26.

Figure 7:
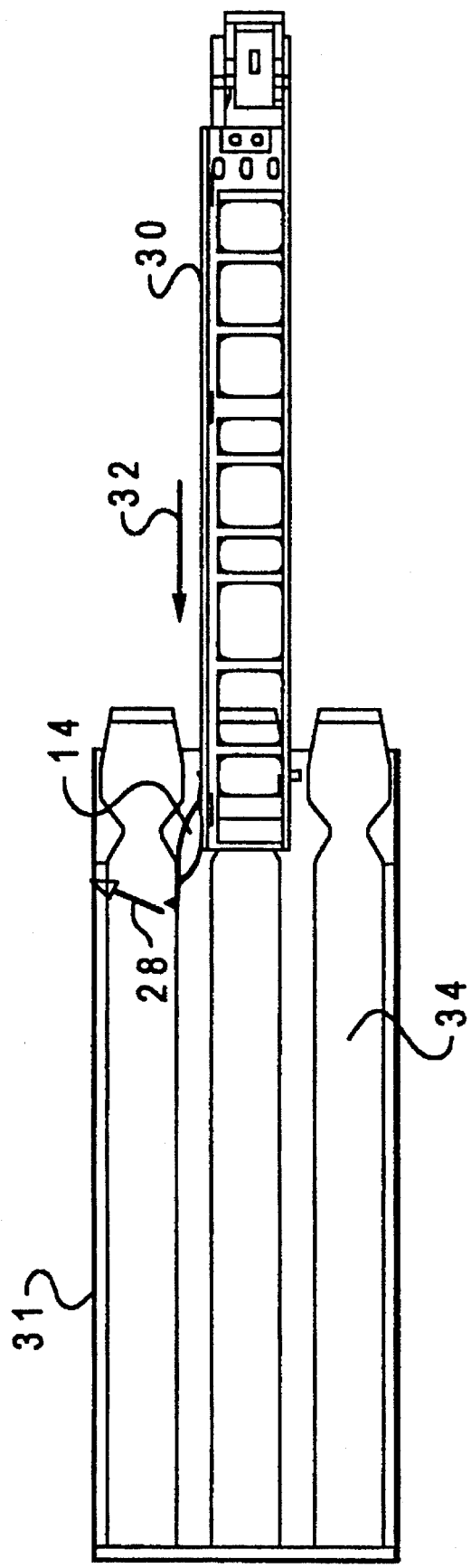
FIG. 7 is a plan view of a chassis containing a spring carrier assembly in accordance with a preferred embodiment of the present invention.

Spring carrier assembly 14 may be pivoted, providing a unique function in accordance with a preferred embodiment of the present invention. As depicted in FIG. 7, spring carrier assembly 14 pivots or rotates in the direction of arrow 28 upon insertion of electronic module 30 in chassis 31 in the direction of arrow 32. The pivoting of spring carrier assembly 14 relieves the load on the assembly and prevents the assembly from deflecting away from the inserted electronic module and into an adjacent slot 34.

The pivoting feature of the spring carrier assembly allows the spring carrier assembly to capitalize on the stiffness of neighboring modules. As a result, spring carrier assemblies can be made very thin and with little regard for lateral stiffness in accordance with a preferred embodiment of the present invention. The thinness of the spring carrier assembly allows it to fit between electronic modules, and the stiffness of the electronic module maintains the spring shape and function.

The spring carrier assembly of the present invention is less prone to handling damage because the spring carrier assembly is mounted to the chassis. The spring carrier assembly would be exposed to handling only during installation and removal of the assembly itself. This prevents the handling damage that is common with EMI grounding springs attached to electronic modules. Furthermore, the spring carrier assembly of the present invention provides additional EMI grounding via the top and bottom pivot and the retaining springs.

While the invention has been particularly shown and described with reference to a preferred embodiment, it will be understood by those skilled in the art that various changes in form arid detail may be made therein without departing from the spirit and scope of the invention.

We claim:

1. A spring carrier assembly for use in a chassis housing electronic components that radiate electromagnetic interference emissions during operation comprising:

an elongated multileaf conductive spring having a free edge and curvededge; and an elongated carrier having a first edge encompassing the curved edge and a second edge encompassing the free edge, wherein portions of the conductive spring are exposed and the elongated carrier has a first pivot member formed at a first end and second pivot member formed at a second end of the first edge.

2. The spring carrier assembly of claim 1, wherein the curved edge of the conductive spring includes a first end and a second end, each of said first and second ends adapted to receive a rod at the first edge of the carrier and wherein the elongated carrier includes a first groove formed within the first end of the first edge and a second groove formed within the second end of the first edge, the first groove being in communication with the first end of the conductive spring and the second groove being in communication with the second end of the conductive spring; and a first rod and a second rod, said first rod being adapted for placement within the first groove of the first edge and the first end of the curved edge and the second rod being adapted for placement within the second groove of the first edge and the second end of the curved edge which secures the curved edge of the conductive spring to the elongated carrier.

3. The spring carrier assembly of claim 1, further comprising a groove formed through the curved edge of the conductive spring and the first end and the second end for receiving a rod; the rod securing the curved edge of the conductive spring to the elongated carrier when placed within the groove.

4. A spring carrier assembly for use in a housing for containing electronic components that radiate electromagnetic interference emissions during operation comprising:

an elongated multileaf conductive spring having a free edge and a curved edge;

an elongated carrier having a first edge section encompassing the curved edge and a second edge section encompassing the free edge, wherein portions of the conductive spring are exposed and the elongated carrier includes a first pivot member formed at a first end and second pivot member formed at a second end of the first edge section, the first pivot member having a first groove formed therein for receiving a first rod and the second pivot member having a second groove formed therein for receiving a second rod, wherein the first and second grooves are in communication with the curved edge of the conductive spring; and the first and second rods securing the curved edge of conductive spring to the carrier when placed within the first and second grooves and within the curved edge.

5. An apparatus for housing electronic modules that radiate electromagnetic interference emissions during operation comprising:

a housing for receiving electronic modules, the chassis having a top and bottom wall, the top wall being parallel to the bottom wall, the top wall having a first array of voids, and the bottom wall having a second array of voids, wherein each void within the first array of voids in the top wall is opposite an opposing void within the second array of voids in the bottom wall and an electronic module may be placed within the housing between the first array of voids and the second array of voids;

a plurality of spring carrier assemblies, each of said spring carrier assemblies placed between a void within the first array of voids and an opposing void within the second arrays of voids and each of said spring carrier assemblies including;

an elongated multileaf conductive spring having a free edge and curved edge; and an elongated carrier having a first edge section encompassing the curved edge and a second edge section encompassing the free edge, wherein portions of the conductive spring are exposed;

a first pivot member formed at a first end of the first edge section and second pivot member formed at a second end of the first edge section, wherein placement of the first pivot member within the void within the first array of voids in the top wall and placement of the second pivot member within the opposing void within the second array of voids in the bottom wall secures the elongated carrier to the housing and wherein each of the spring carrier assemblies may pivot to allow placement of an electronic module next to the spring carrier assembly; and wherein the plurality of said spring carrier assemblies are arranged in an array and the electronic module may be placed within the housing between two of said spring carrier assemblies.

6. The apparatus of claim 5 further comprising a third array of voids in the top wall and a fourth array of voids in the bottom wall and a second array of said spring carrier assemblies secured to the voids within the third array of voids and the fourth array of voids.

7. The apparatus of claim 5 wherein each of said spring carrier assemblies includes a retaining spring connected to the first pivot member for biasing each of the spring carrier assemblies towards the bottom wall.

8. The apparatus of claim 7 wherein each of the spring carrier assemblies includes a member extending from an end of the second edge section, wherein the member reduces pivoting of each of the spring carrier assemblies.

* * * * *

UNITED STATES PATENT AND TRADEMARK OFFICE
CERTIFICATE OF CORRECTION

PATENT NO. : 5,534,662
DATED : July 9, 1996
INVENTOR(S) : Peacock et al.

It is certified that error appears in the above-indentified patent and that said Letters Patent is hereby corrected as shown below:

Column 4, line 27: change "arid" to --and--

Column 4, line 34: change "curvededge" to --curved edge--

Signed and Sealed this

Twenty-fourth Day of December, 1996

Attest:

BRUCE LEHMAN

*Attesting Officer*     *Commissioner of Patents and Trademarks*